(12) United States Patent
Chan et al.

(10) Patent No.: US 8,981,813 B2
(45) Date of Patent: Mar. 17, 2015

(54) METHOD AND APPARATUS FOR FACILITATING COMMUNICATION BETWEEN PROGRAMMABLE LOGIC CIRCUIT AND APPLICATION SPECIFIC INTEGRATED CIRCUIT WITH CLOCK ADJUSTMENT

(71) Applicant: Agate Logic Inc., Sunnyvale, CA (US)

(72) Inventors: Kai Keung Chan, Fremont, CA (US); David Tsang, Los Altos, CA (US); Shian-Jiun Fu, Sunnyvale, CA (US); Chao-Chiang Chen, Cupertino, CA (US)

(73) Assignee: Agate Logic, Inc., Santa Clara, CA (US)

( * ) Notice: Subject to any disclaimer, the term of this patent is extended or adjusted under 35 U.S.C. 154(b) by 37 days.

(21) Appl. No.: 13/689,719

(22) Filed: Nov. 29, 2012

(65) Prior Publication Data

US 2013/0154686 A1 Jun. 20, 2013

Related U.S. Application Data

(60) Provisional application No. 61/565,363, filed on Nov. 30, 2011, provisional application No. 61/565,344, filed on Nov. 30, 2011.

(51) Int. Cl.
*G06F 7/38* (2006.01)
*H03K 19/177* (2006.01)
*H03K 19/0175* (2006.01)
*H03K 3/02* (2006.01)

(52) U.S. Cl.
CPC ........ *H03K 19/017581* (2013.01); *H03K 3/02* (2013.01); *H03K 19/17736* (2013.01)
USPC ................... 326/40; 326/39; 326/41; 326/47

(58) Field of Classification Search
None
See application file for complete search history.

(56) References Cited

U.S. PATENT DOCUMENTS

| 6,211,697 B1 * | 4/2001 | Lien et al. ...................... 326/41 |
| 6,747,479 B1 * | 6/2004 | Coppola et al. ................ 326/41 |
| 7,724,028 B1 * | 5/2010 | Ansari et al. ................... 326/38 |

* cited by examiner

*Primary Examiner* — Anh Tran
(74) *Attorney, Agent, or Firm* — James M. Wu; JW Law Group

(57) ABSTRACT

A logic processing device, containing an application specific integrated circuit ("ASIC") and field programmable gate array ("FPGA"), capable of automatically interfacing between ASIC and FPGA is disclosed. The logic processing device, in one aspect, includes a phase adjustment circuit, ASIC, and configurable logic circuit ("CLC") wherein the CLC can be an FPGA. While ASIC is able to perform a specific function in accordance with an ASIC clock domain, the CLC is capable of performing a programmable logic function in accordance with an FPGA clock domain. The phase adjustment circuit is used to automatically facilitate a communication between the ASIC and the CLC in accordance with the ASIC clock domain and the FPGA clock domain.

18 Claims, 10 Drawing Sheets

METHOD AND APPARATUS FOR FACILITATING COMMUNICATION BETWEEN PROGRAMMABLE LOGIC CIRCUIT AND APPLICATION SPECIFIC INTEGRATED CIRCUIT WITH CLOCK ADJUSTMENT

PRIORITY

This application claims the benefit of priority based upon U.S. Provisional Patent Application Ser. No. 61/565,344, filed on Nov. 30, 2011 and entitled "Method and apparatus for providing communication between programmable logic circuit and application specific integrated circuit using clock adjusting circuit," and U.S. Provisional Patent Application Ser. No. 61/565,363, filed on Nov. 30, 2011 and entitled "Method and apparatus for providing interface between application specific integrated circuit and configurable logic device," all of which are hereby incorporated herein by reference in their entireties.

FIELD OF THE INVENTION

The exemplary embodiment(s) of the present invention relates to the field of semiconductor and integrated circuits. More specifically, the exemplary embodiment(s) of the present invention relates to semiconductor circuits having programmable capabilities.

BACKGROUND OF THE INVENTION

To implement a set of desirable logic functions, an integrated circuit ("IC") designer typically uses variety of options or approaches to achieve such functions using, for instance, conventional semiconductor ICs. Conventional semiconductor IC, for example, includes application-specific ICs ("ASICs") and/or programmable logic devices ("PLDs") or field programmable gate arrays ("FPGAs"). ASIC is a semiconductor fabricated chip typically containing various circuits specifically customized or configured to perform a designated set of function(s) and/or purpose(s). ASIC chips generally provide efficient performance with fast clock cycles. Since ASIC is customized for a particular functionality, a drawback associated with the ASIC chip is unalterable after the chip is fabricated.

PLDs or FPGA, on the other hand, is alterable after the chip is fabricated because an FPGA can be programmed to perform a user designated specific function. A typical PLD or FPGA includes multiple programmable logic blocks, routing resources, and input/output ("I/O") pins. An IC designer is able to select a desirable logical function(s) for the FPGA to perform. Although a PLD or FPGA is more versatile or flexible, it is typically high cost (large die size), high power consumption, and relatively low performance partially because it operates relatively low clock cycles or speed. A drawback associated with a typical PLD or FPGA is relatively low speed as well as excessive power consumption.

With increasing demand in high performance, power conservation, as well as some degree of functional flexibility, an IC combining ASIC and FPGA is proposed to leverage unique features of both ASIC and FPGA for optimizing IC performance. A problem, however, associated with such combination of ASIC and FPGA is communication between ASIC and FPGA since ASIC and PLD typically operate in different clock domains. For example, ASIC typically operates clock cycles faster than clock cycles used by FPGA.

A conventional approach to mitigate clock differences is to provide an asynchronous first-in first-out ("FIFO") buffer between FPGA and ASIC for decoupling FPGA clock domain from ASIC clock domain. A problem associated with this approach is added latency for data flows between FPGA and ASIC. For certain applications, such added latency is not acceptable.

SUMMARY

A digital logic processing system containing an ASIC and FPGA capable of providing automatically interface or communication between ASIC and FPGA is disclosed. The system, in one aspect, includes a phase adjustment circuit, ASIC, and configurable logic circuit ("CLC") such as FPGA or PLD. While ASIC is able to perform a specific function in accordance with an ASIC clock domain, the CLC is capable of performing a programmable logic function in accordance with an FPGA clock domain. The phase adjustment circuit which may reside within the CLC is able to automatically facilitate or establish a communication between ASIC and the CLC in accordance with the ASIC clock domain and the FPGA clock domain.

Additional features and benefits of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
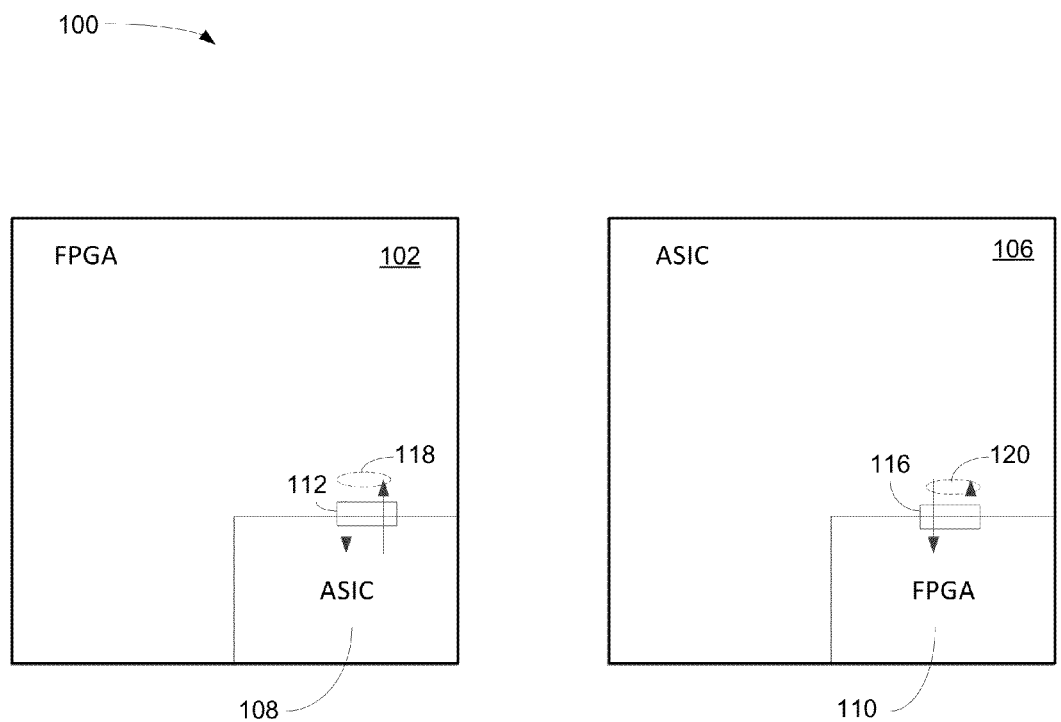
FIG. 1 is a block diagram illustrating custom FPGA ("cFPGA") able to automatically establish a communication with ASIC and FPGA via clock skew adjustment in accordance with one embodiment of the present invention.

Exemplary embodiment(s) of the present invention is described herein in the context of a method, device, and apparatus that automatically establishes communication between ASIC and FPGA using clock adjustment.

Those of ordinary skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. In addition, those of ordinary skills in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processors and systems, control logic, ASICs, chips, workstations, mainframes, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to the block and flow diagrams, are typically performed in a different serial or parallel ordering and/or by different components and/or over different connections in various embodiments in keeping within the scope and spirit of the invention.

IP communication network, IP network, or communication network means any type of network having an access network able to transmit data in the form of packets or cells, such as ATM (Asynchronous Transfer Mode) type, on a transport medium, for example, the TCP/IP or UDP/IP type. ATM cells are the result of decomposition (or segmentation) of packets of data, IP type, and those packets (here IP packets) comprise an IP header, a header specific to the transport medium (for example UDP or TCP) and payload data. The IP network may also include a satellite network, a DVB-RCS (Digital Video Broadcasting-Return Channel System) network, providing Internet access via satellite, or an SDMB (Satellite Digital Multimedia Broadcast) network, a terrestrial network, a cable (xDSL) network or a mobile or cellular network (GPRS/EDGE, or UMTS (where applicable of the MBMS (Multimedia Broadcast/Multicast Services) type, or the evolution of the UMTS known as LTE (Long Term Evolution), or DVB-H (Digital Video Broadcasting-Handhelds)), or a hybrid (satellite and terrestrial) network.

One embodiment of the present invention discloses a logic digital processing system configured to automatically establish a communication between ASIC and FPGA via clock adjustment. For example, the digital processing system having ASIC and FPGA includes a clock or phase adjustment device or circuit which is used to automatically establish an interface between ASIC and FPGA. The system, in one aspect, includes a phase adjustment circuit, ASIC, and configurable logic circuit ("CLC") wherein the CLC can be FPGA, PLD, or programmable logic circuit. While ASIC is able to perform a specific function in accordance with an ASIC clock domain, the CLC is capable of performing a user selected function in accordance with an FPGA clock domain. The phase adjustment circuit, in one embodiment, provides a function or interface of automatically facilitating communication between ASIC and CLC according to ASIC clock domain and/or FPGA clock domain.

FIG. 1 is a block diagram 100 illustrating a custom FPGA ("cFPGA") able to automatically establish a communication between ASIC and FPGA using clock skew adjustment in accordance with one embodiment of the present invention. Diagram 100 illustrates two exemplary cFPGA wherein cFPGA 102 is an FPGA based chip containing an ASIC portion 108 while cFPGA 106 is an ASIC based chip including an FPGA portion 110. In one aspect, cFPGA 102 or 106 is designed to combine the flexibility of FPGA with the high performance and low power consumption of ASIC. It should be noted that the underlying concept of the exemplary embodiment(s) of the present invention would not change if one or more blocks (or devices) were added to or removed from diagram 100.

cFPGA 102, in one example, includes an ASIC portion 108 which may be designed as an extension to a FPGA device. Alternatively, cFPGA 106 includes an FPGA 110 which can be an extension of an ASIC device. To facilitate seamless communication 118-120 between FPGA circuitry and ASIC circuitry, a clock domain adjustment component 112 or 116 is used. Upon detecting different clock signals and/or clock speeds between FPGA and ASIC, clock domain adjustment component 112 or 116, in one embodiment, adjusts or compensates clock skews whereby communications 118-120 can be properly established. To establish an interface between FPGA and ASIC, clock skew between FPGA and ASIC needs to be controlled.

It should be noted that when FPGA is designed and instantiated inside ASIC or cFPGA, FPGA can also be referred to as an embedded FPGA ("eFPGA"). In one embodiment, eFPGA has a built-in de-skew capability that automatically establishes communication between FPGA and ASIC circuitries by adjusting and/or compensating clock differences.

FPGA or PLD is a semiconductor chip that includes an array of programmable logic array blocks ("LABs"), routing resources, and input/output ("I/O") pins. Each LAB may further include multiple programmable logic elements ("LEs"). For example, a LAB consists of 16 LEs, wherein each LE can be specifically programmed to perform a function or a set of functions. Routing resources in a PLD are organized in multiple banks of routing circuits, such as routing multiplexers or selectors for routing various signals between I/O pins, feedback outputs, and LAB inputs. Each bank of the routing multiplexers is generally organized in finite number multiplexers for routing various signals received by the bank.

Figure 2:
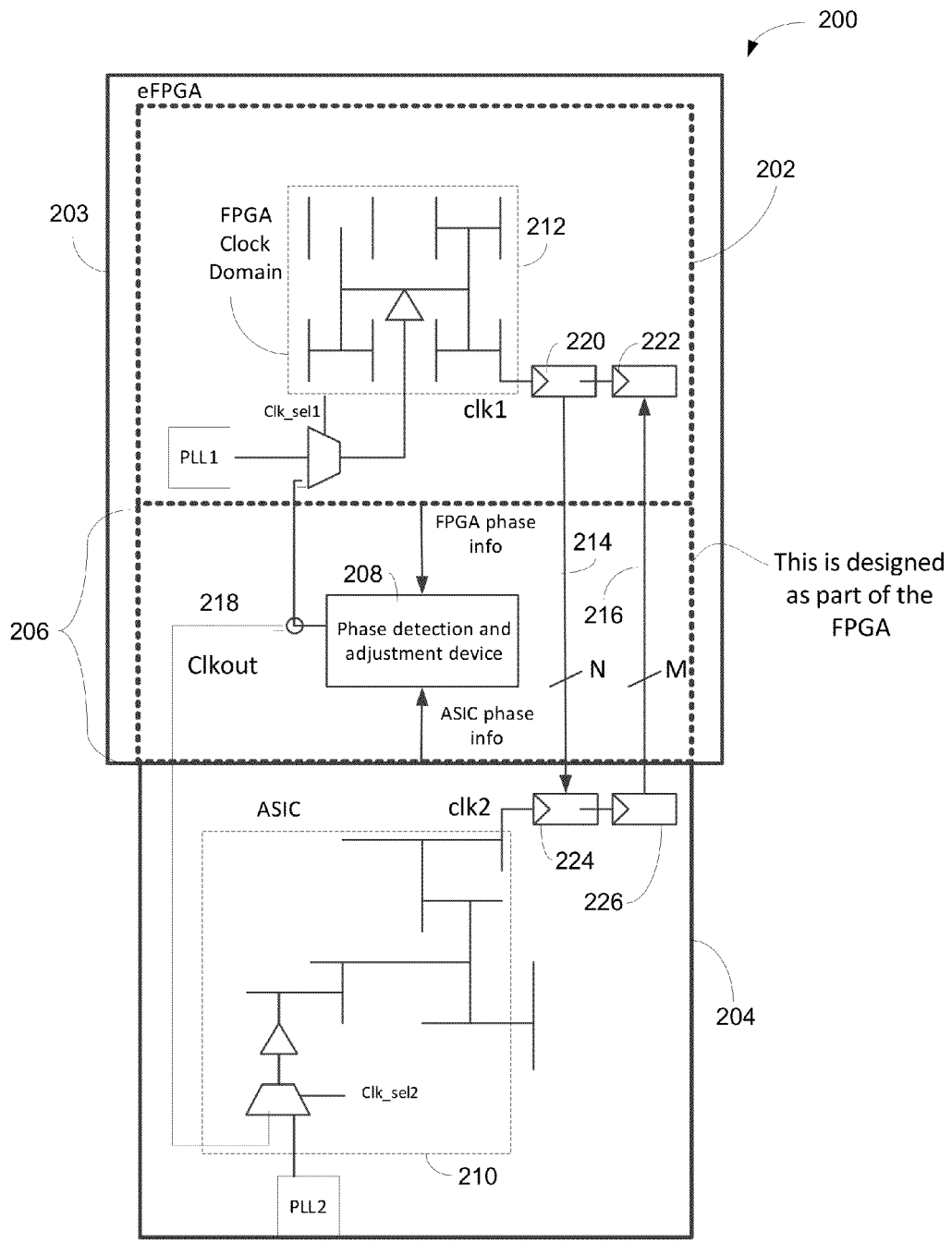
FIG. 2 is a block diagram illustrating a data processing device having a clock skew adjustment which is used to provide interface between ASIC and FPGA in accordance with one embodiment of the present invention.

FIG. 2 is a block diagram illustrating a data processing device 200 having a clock skew adjustment which is used to provide interface between ASIC and FPGA in accordance with one embodiment of the present invention. Data processing device 200 includes CLC 202, ASIC 204, and phase adjustment circuit ("PAC") 206. In one aspect, device 200 can be used in computing systems, personal computers ("PCs"), tablets, smart phones, servers, mainframes, routers, switches, and the like. It should be noted that the underlying concept of the exemplary embodiment(s) of the present invention would not change if one or more blocks (or devices) were added to or removed from device 200.

ASIC 204 includes an ASIC clock tree 210, phase lock loop 2 ("PLL2"), data receiver 224, and data transmitter 226. ASIC 204 is configured to perform a specific set of functions in accordance with an ASIC clock domain. Note that ASIC is a semiconductor based fabricated integrated circuit which is customized for performing a particular purpose or function. ASIC clock tree 210 and PLL2 for example are used to provide and maintain the ASIC clock domain. It should be noted that it does not alter the inventive concept if additional logic component(s) are added or removed from ASIC 204.

CLC 202, which can be an FPGA and/or PLD, includes an FPGA clock tree 212, PPL1, data transmitter 220, and data receiver 222. CLC 202 is configured to perform a programmable logic function(s) in accordance with a programmable clock domain such as FPGA clock domain, hereinafter referred to as FPGA clock domain. CLC 202 is a semiconductor based FPGA or cFPGA containing lookup tables ("LUTs"), programmable routing fabric, and nonvolatile programmable memory wherein the cFPGA is configurable to perform one of user's selected logic functions. The programmable routing fabric can also be referred to as routing connections, connections, and/or routing resources. It should be noted that ASIC clock cycle generally has higher frequency than FPGA clock cycle.

PAC 206, in one embodiment, includes phase detection and adjustment device 208 capable of detecting FPGA phase information as well as ASIC phase information. Upon identifying different clock cycles used in ASIC and FPGA, PAC 206 is able to establish a communication between ASIC and FPGA by adjusting or compensating clock skews between ASIC clock domain and/or FPGA clock domain. After clock skew adjustment, PAC 206 is able to facilitate communication between the ASIC and the CLC while majority of ASIC circuits operate under the ASIC clock domain and majority of CLC circuits operate under the PFGA clock domain.

PAC 206, in one example, is fabricated together with cFPGA 202 to form an eFPGA 203. PAC 206 may further include a delay clock circuit configured to adjust ASIC I/O (input and output) clock in ASIC clock domain whereby I/O data between ASIC and CLC are reliably captured. Similarly, PAC 206 can also adjust FPGA I/O clock at FPGA clock domain so that the data inputs or outputs between ASIC and CLC can be reliably received and processed. PAC 206, in one embodiment, is able to detect ASIC clock domain and FPGA clock domain, and subsequently provides a calibration pattern 218 to the ASIC and FPGA so that the pattern 218 can be used to compensate phase differences between ASIC and FPGA whereby the data capture between ASIC and CLC can be reliably improved.

Device 200 illustrates a scheme for automatic establishment of data communication between ASIC operating in one clock domain and FPGA operating in another clock domain. To establish a communication between two circuits operating in different clock cycles, the clock skew needs to be identified and overcome. By removing or compensating clock skew between FPGA and ASIC, the data and/or signals can reliably travel between FPGA and ASIC. Phase detection and adjustment device 208, in one embodiment, is used to collect the phase information from FPGA as well as ASIC. The delay-adjusted clock (Clkout) 218 can be used by FPGA or ASIC depending on settings of clock multiplexor clk_sel1 and clk_sel2 as shown in FIG. 2.

An advantage of using eFPGA 203 having PAC 206 for de-skewing clock skews is that the users do not need to adjust or tune clock phases between ASIC and FPGA because PAC 206 provides de-skew logic automatically. It should be noted that the phase information between FPGA and ASIC is not limited to the clocks such as clk1 and clk2, data signals between ASIC and FPGA are also an important factor.

Figure 3:
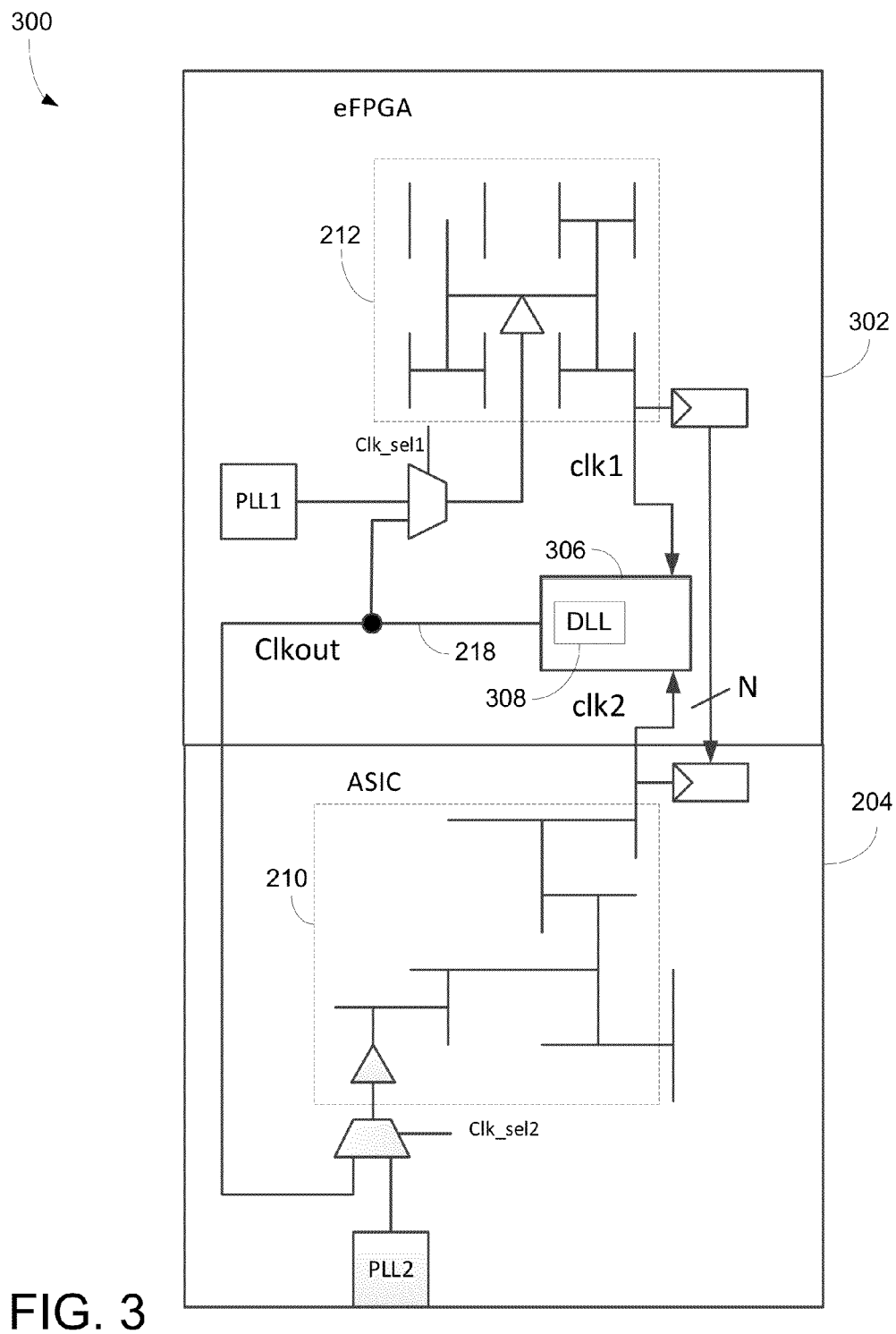
FIG. 3 is a block diagram illustrating an alternative layout of cFPGA configured to provide clock adjustment between ASIC and FPGA using PAC with a DLL circuitry in accordance with one embodiment of the present invention.

FIG. 3 is a block diagram illustrating an alternative layout of cFPGA 300 able to provide clock adjustment between ASIC and FPGA using PAC 306 with a DLL circuitry 308 in accordance with one embodiment of the present invention. cFPGA 300, which is similar to device 200 shown in FIG. 2, includes an eFPGA 302, ASIC 204, and PAC 306. While eFPGA 302 includes FPAG or CLC component(s) clocked by FPAG clock tree 212, ASIC 204 includes custom designed logic circuitry clocked by ASIC clock tree 210. It should be noted that the underlying concept of the exemplary embodiment(s) of the present invention would not change if one or more blocks (or components) were added to or removed from cFPGA 300.

In one embodiment, PAC 306 including a de-skew algorithm is able to detect phase or frequency difference between clk1 and clk2 as shown in FIG. 3. Clk1, used to clock FPGA elements, is a set of clock signals managed by FPGA clock tree 212. Clk2, used to clock ASIC element, is a set of clock signals managed by ASIC clock tree 210. To enhance data integrate and/or reliability during data-read and/or data-receive operation(s), PAC 306 having DLL circuitry 308 is able to adjust clock signals and/or sampling intervals whereby more accurate reading can be achieved.

Depending on the applications, eFPGA 300 may either use clk1 to sample clk2 or use clk2 to sample clk1. Upon identifying clk1 and clk2, eFPGA 300 generates Clkout 218 which is subsequently fed to FPGA and/or ASIC clock trees 210-212 for de-skewing or compensating clock speed or phase differences. For example, edge alignment between clk1 and clk2 may be adjusted in accordance with clkout 218 whereby the data capturing can be improved. Alternatively, DLL circuit 308 is used in eFPGA 300 which can be instantiated in any ASIC whereby the clocks between ASIC and FPGA can be de-skewed automatically.

Figure 4:
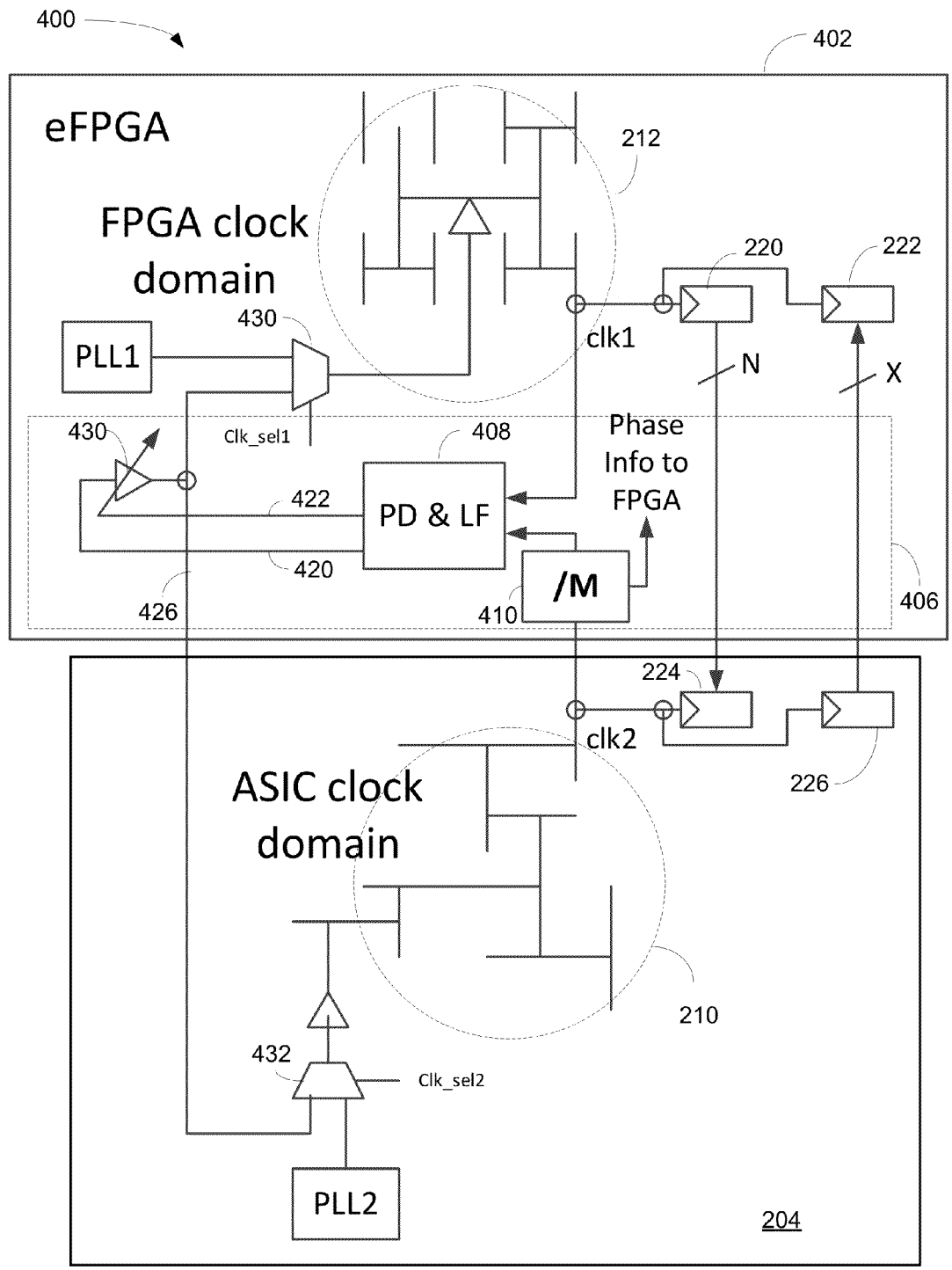
FIG. 4 is a block diagram illustrating a more detailed clock adjustment component configured to automatically establish a communication between ASIC and FPGA in accordance with one embodiment of the present invention.

FIG. 4 is a block diagram 400 illustrating a more detailed clock adjustment component configured to automatically establish a communication between ASIC and FPGA in accordance with one embodiment of the present invention. Diagram 400, which is similar to device 200 shown in FIG. 2, includes an eFPGA 402, ASIC 204, and PAC 406. While eFPGA 402 includes FPAG or CLC elements clocked by FPAG clock tree 212, ASIC 204 includes custom designed logic elements clocked by ASIC clock tree 210. To facilitate or establish a communication for data transfer between FPGA and ASIC, diagram 400 illustrates an implementation of using PLL2 and PLL1 to adjust FPGA and ASIC clock domains. It should be noted that FPGA clock signals and ASIC clock signals are asynchronous clock signals.

PAC 406, in one embodiment, includes an ASIC phase detector 410, phase detector & loop filter ("PDLF") 408, and delay adjuster 410. Upon receipt of clk2 from ASIC 204, phase detector 410 captures clk2 and provides ASIC phase information in accordance with clk2 to FPGA and PDLF 408. Note that the clock used by phase detector 410 can be adjusted so that it has enough clock speed to capture clk2. It should be further noted that clk2 is at least partially facilitated by PLL2 in ASIC 204. Upon receiving clk1 from FPGA clock tree 212 facilitated by PLL1, PDLF 408 compares or processes clk1 and clk2 and generates a clkout 420 and delay signal 422. Delay adjuster 430 generates a clock adjustment signal 426 in response to clkout 420 and delay signal 422. Clock adjustment signal 426 is fed to multiplexers 430-432 for clock adjustment. It should be noted that clk2 may be driven by a higher frequency crystal clock than clk1.

In one operation, phase detector 410 employs a fast clock such as using clk2 to identify the speed of clock signals operated in ASIC clock domain. Upon detecting ASIC clock domain, PDLF 408 adjusts clock phase, clock waveforms, or clock signals to ascertain capturing of data stream traveling between ASIC and FPGA. Since FPGA clock domain usually operates a low clock speed than ASIC clock domain, FPGA can widen its data bus to compensate its slower clock speed.

An advantage of using PAC 406 is to automatically establish communications between two ICs or chips operating in different clock speeds.

Figure 5:
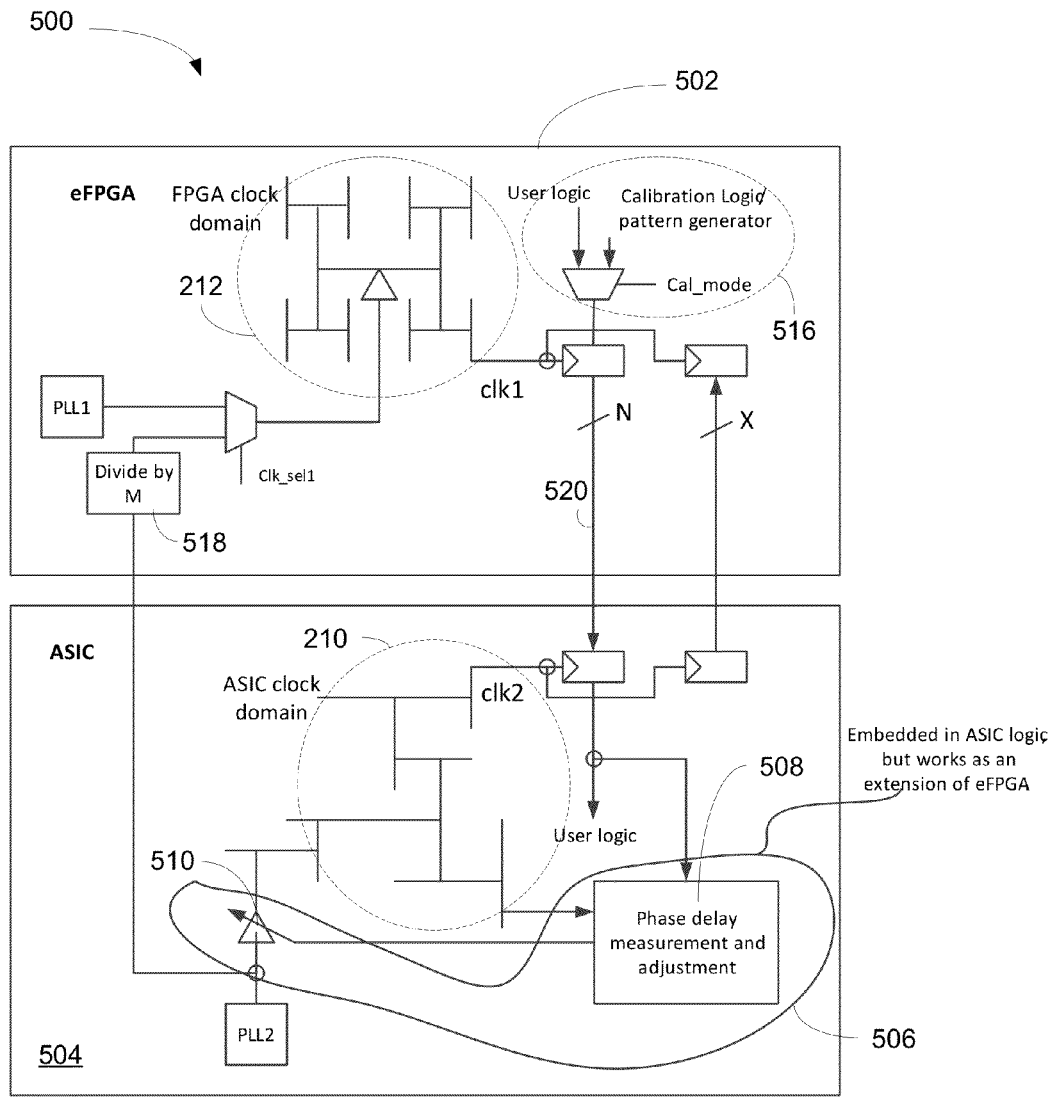
FIG. 5 shows a diagram illustrating an alternative scheme for de-skew clock control in accordance with one embodiment of the present invention.

FIG. 5 shows a diagram 500 illustrating an exemplary scheme for de-skew clock control in accordance with one embodiment of the present invention. Diagram 500, which is similar to device 200 shown in FIG. 2, includes an eFPGA 502 and ASIC 504 wherein ASIC 504 includes a de-skew logic 506. De-skew logic 506, in one embodiment, includes a phase delay measurement and adjustment ("PDMA") 508 and a delay adjuster 510. While eFPGA 502 includes FPAG or CLC elements clocked by FPAG clock tree 212, ASIC 504 includes custom designed logic elements clocked by ASIC clock tree 210. It should be noted that the underlying concept of the exemplary embodiment(s) of the present invention would not change if one or more blocks (or devices) were added to or removed from diagram 500.

Diagram 500 illustrates a scheme in which delay measurement and adjustment are not derived from operating clocks (i.e. clk1 and clk2) instead using data patterns. In one operation, a calibrator 516 at eFPGA 502 issues or sends calibration patterns or data stream to ASIC 504 via connection 520. Upon receipt of the calibration patterns, clk2 or clock signal on ASIC side is adjusted in accordance with the calibration patterns which arrive reliably. Alternatively, clk2 is adjusted based on failure of capturing or receiving the calibration patterns. After one or more iterations, margins of data capturing windows or edges can be calculated or identified whereby optimal placement of data capturing edge is determined. De-skew logic 506 can be embedded inside ASIC logic as an extension IP (intellectual property) of eFPGA. De-skew logic 506, for example, includes delay adjuster 510 used to adjust PLL2 output.

In one operation, the calibration patterns can be any patterns depending on the applications and ICs used. For example, a calibration of toggling pattern such as 10101010 can be used to calibrate or align edges of different clock signals. Note that a pattern having 127-bit or $(2^{32-1})$ bit Pseudo Random Binary Sequence can be used to calibrate optimal clock edges for data capturing.

An advantage of using de-skew logic 506 together with calibration logic is that it uses ASIC clock to identify or detect clock phase differences since ASIC clock is usually faster than FPGA. For example, clk1 may have integer multiple (e.g. M) than clk2. Under this condition, the pattern sampled by clk2 is oversampled by M. The oversampling rate can help delayed adjustment device for reliably lock on a 180-degree phase of clock cycle.

Figure 6:
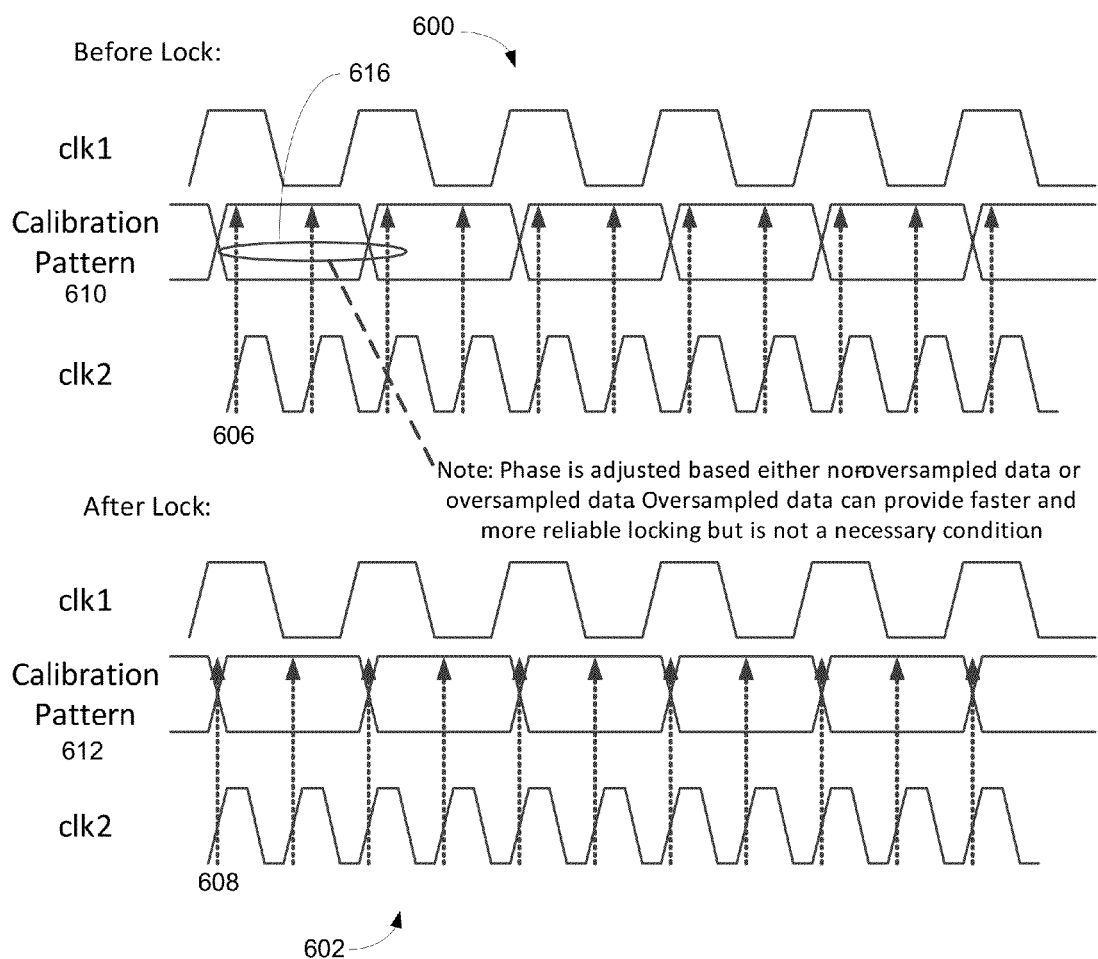
FIG. 6 is a clock diagram illustrating an example of phase adjustment between two different clocks in accordance with one embodiment of the present invention.

FIG. 6 is a clock diagram illustrating an example of phase adjustment between two different clocks in accordance with one embodiment of the present invention. The clock diagram illustrates two clock waveforms 600-602 wherein clock waveform 600 shows clock signals without clock adjustment and clock waveform 602 shows clock signals with clock adjustment. Clock waveform 600, in one example, includes clk1, clk2, and calibration pattern 610. Clock waveform 602 includes clk1, clk2, and calibration pattern 612. Clock waveforms 600-602 illustrate a process of phase adjustment(s) using previous discussed schemes. The non-oversampled data and/or oversampled data may be used to provide phase information through, for example, calibration pattern 610 or 612 generated by FPGA.

Clk2, which is used in ASIC, is configured to be double or twice as fast as the frequency of clk1 which is used in FPGA. The delay adjustment device, in one embodiment, is able to drive clk2 to an optimal sampling phase and identify more or enhanced reliable sampling edge for data flows in view of clk1 and clk2 domains. Arrows 608, for example, indicate optimal sampling points. To improve sampling window, Clk2 in clock waveform 602, for example, is adjusted or shifted so that one of the mid-point of raising edge of clk2 is aligned with the beginning of calibration pattern 612.

Clock waveform 600 illustrates a clk1 waveform, a clk2 waveform, and calibration pattern 610 wherein clk2 runs twice as fast as clk1. Since clk1 and clk2 are not locked, sampled area 616 illustrates that phase is adjusted based on either non-oversampled data or oversampled data, wherein oversampled data can provide faster and reliable locking which, however, is not a necessary condition. Clock waveform 602 illustrates a clk1 waveform, a clk2 waveform, and calibration pattern 612 wherein clk2 runs double speed as clk1. Since clk1 and clk2 are locked, the edges of calibration pattern 612 and raising edge of clk2 are aligned more closely as indicated by numeral 608.

An advantage of oversampling is that if oversampled data is obtained, it can achieve fast lock time using algorithms and/or variations of algorithms related to bang-bang phase detector. Another advantage of oversampling is that no added load to established clock tree in FPGA and/or ASIC. Note that FPGA and/or ASIC clock synthesis can negatively affect load balance in local clock tree. Furthermore, another advantage of oversampling is to simplify interface between FPGA and ASIC. Note that it is not necessary to build special interface between FPGA and ASIC when the embodiment of present invention is employed. It should be further noted that flip-flops may be used for facilitating normal functional path and for detecting clock phase with oversampled data.

Figure 7:
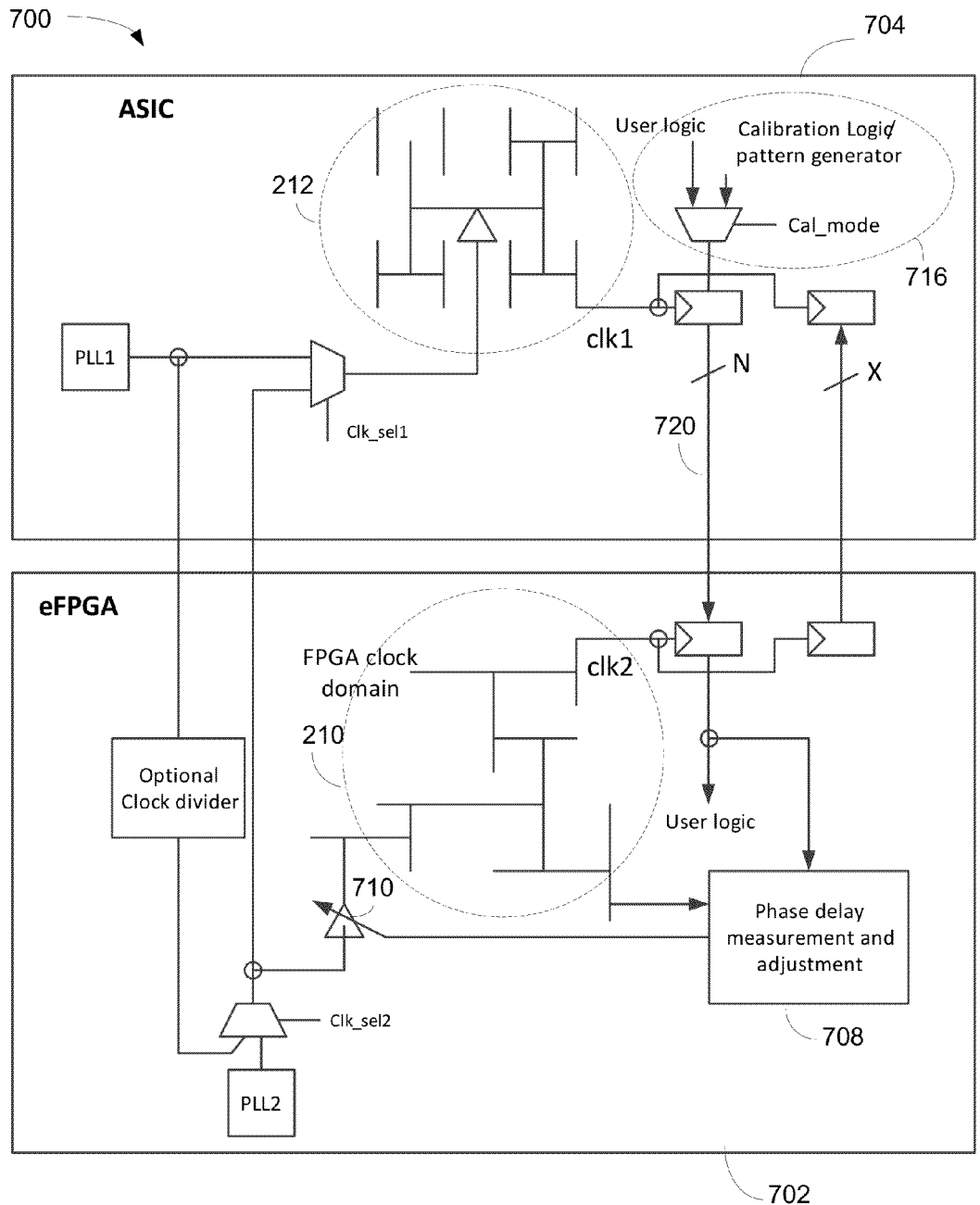
FIG. 7 is a clock diagram illustrating an exemplary eFPGA having a phase delay measurement and adjustment ("PDMA") to provide an automatic connection between FPGA and ASIC in accordance with one embodiment of the present invention.

FIG. 7 is a diagram 700 illustrating an exemplary eFPGA having a phase delay measurement and adjustment ("PDMA") to provide an automatic connection between FPGA and ASIC in accordance with one embodiment of the present invention. Diagram 700, which is similar to device 200 shown in FIG. 2, includes an eFPGA 702 and ASIC 704 wherein eFPGA 702 includes a de-skew logic. The de-skew logic, in one embodiment, includes PDMA 708 and a delay adjuster 710. While eFPGA 702 includes FPAG or CLC programmable elements clocked by FPAG clock tree 212, ASIC 704 includes custom designed logic elements clocked by ASIC clock tree 210. It should be noted that the underlying concept of the exemplary embodiment(s) of the present invention would not change if one or more blocks (or devices) were added to or removed from diagram 700.

Diagram 700 illustrates a method or technique using calibration patterns generated by calibration logic or pattern generator 716 for detecting clock skews. Upon detecting the clock skew(s), PDMA 708 is used to de-skew or compensate clock difference between FGPA and ASIC whereby the data flow can safely travel between FPGA and ASIC. It should be noted that the mechanism shown in FIG. 7 is similar to the mechanism shown in FIG. 5 except that the de-skew circuit is placed inside eFPGA 702 while ASIC containing pattern generator 716 is used to generate the calibration patterns. Note that the calibration patterns can travel via connection 720.

Figure 8:
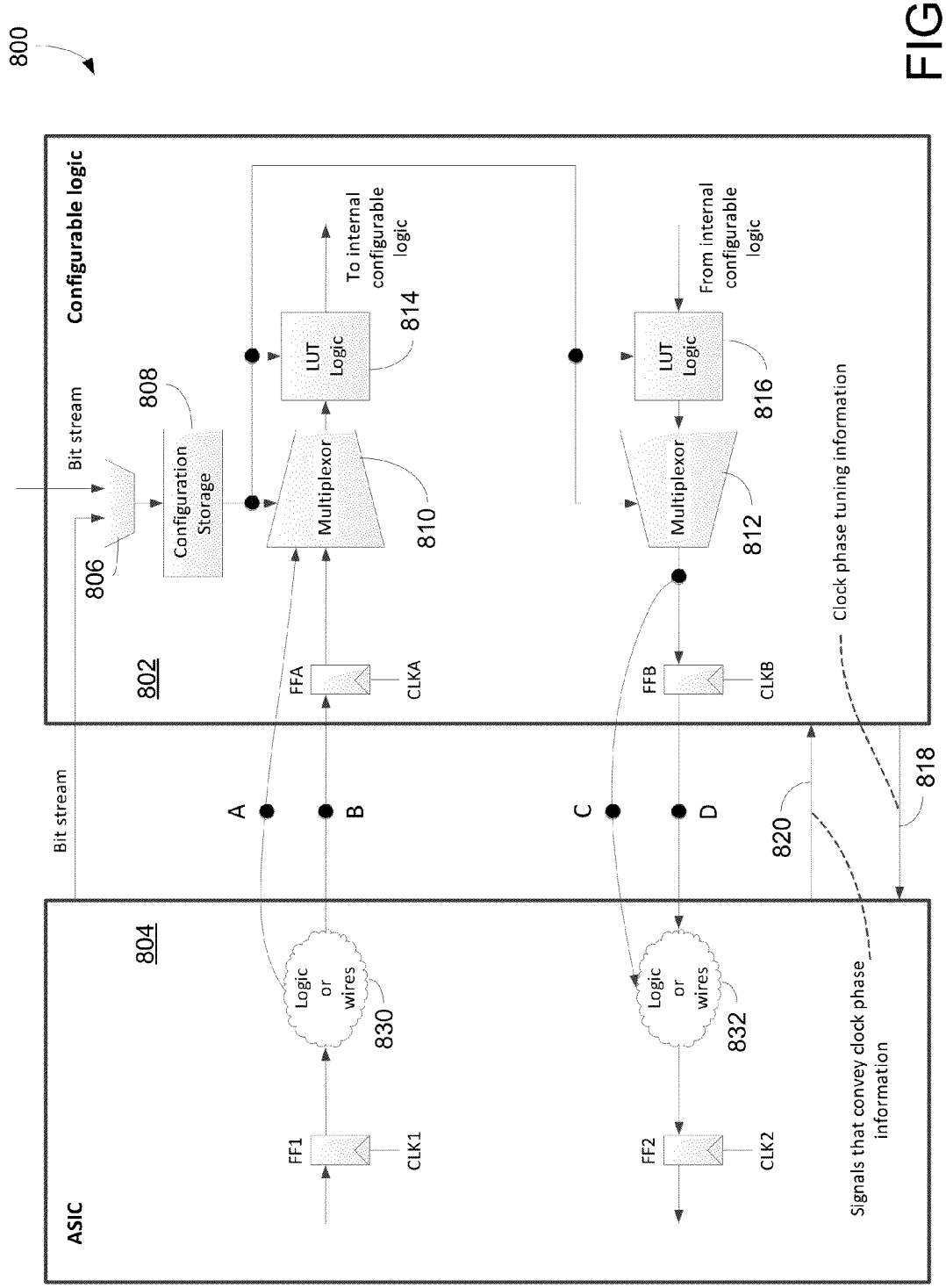
FIG. 8 is a block diagram illustrating a logic processing device using configurable logic to automatically establish a communication between CLC and ASIC in accordance with one embodiment of the present invention.

FIG. 8 is a block diagram illustrating a logic processing device 800 using configurable logic to automatically establish a communication between CLC and ASIC in accordance with one embodiment of the present invention. Device 800 includes ASIC 804, CLC 802, and connecting nodes A-D. Nodes A-D, in one example, can include additional circuitry as well as connections. It should be noted that the underlying concept of the exemplary embodiment(s) of the present invention would not change if one or more circuits (or connections) were added to or removed from device 800.

ASIC 804 includes an ASIC transmitting component 830, ASIC receiving component 832, flip-flop 1 ("FF1"), and FF2, wherein FF1 and FF2 are clocked or driven by clk1 and clk2, respectively. ASIC 804 is able to perform a specific set of functions in response to clock signals such as clk1 and clk2 controlled by the ASIC clock domain. In one embodiment, ASIC 804 provides signals that convey clock phase information to CLC 802 via connection 820 and CLC 802 subsequently sends clock phase tuning information to ASIC 804 via connection 818. The clock phase tuning information, in one aspect, is generated based on received clock phase information from ASIC together with CLC own clock domain. In one example, ASIC 804 is able to adjust the ASIC clock domain in accordance with the clock phase tuning information sent from CLC 802 to improve reliability of information or data capturing. ASIC transmitting component 830 may includes FF1 clocked by clk1. ASIC receiving component 832 includes FF2 clocked by clk2.

CLC 802 includes a programmable component, output component, and input component, wherein the programmable component includes a multiplexer ("mux") 806 and configuration storage 808. The output component includes a mux 812, look-up table ("LUT") logic 816, and FFB clocked by clkB, while the input component includes a mux 810, LUT logic 814, and FFA clocked by clkA. Configuration storage 808 includes at least one programmable bit used to control the behavior of muxes 810-12 and LUT logics 814-816. Mux 810 is able to be programmed for selecting an input from node A or node B. Noted that clkA and B are controlled in accordance with FPGA clock domain. Mux 812, or output multiplexor, of CLC sends or forwards an output to ASIC receiving component 832 via either node C or node D depending on the value of the programmable bit. In one embodiment, configuration storage 808 includes multiple programmable bits and is able to receive a bit stream from ASIC 804 or an external source via mux 806 to program at least a portion of programmable bits.

In one embodiment, CLC 802 provides programmable functionality to a chip or IC that otherwise its functions are fixed during the fabrication process. ASIC transmitter component 830, including processing logic and/or wire connections, is connected to a configurable multiplexor 810 through node A or FFA through node B. ASIC receiving component 832, including processing logic and/or wires, is able to receive input(s) from node C which is fed by configurable multiplexor 812 or from node D which is fed by FFB. Note that the configuration in CLC 802 can be programmed through a bit stream coming from ASIC 804 or from other sources outside CLC 802.

Referring back to FIG. 8, ASIC logic provides signals that convey clock phase information via connection 820 to CLC 802 which in turns provides clock phase tuning information back to the ASIC logic via connection 818. The clock phase of CLK1 and CLK2 can be tuned based on the received clock phase tuning information. Once the clk1 and clk2 are tuned or modified, signals or data at the inputs of FFs can be captured reliably.

Alternatively, upon receipt of clock phase information conveyed via line 820 from ASIC logic, CLC 802 provides clock phase tuning information internally to tune the clock phase of clkA and clkB such that inputs of FFs at the interface (FF2, FFA) can be captured reliably. One example of the signal that conveys clock phase information can be obtained via clk1 or clk2. Another example is the transition information conveyed through node A or node B from special training patterns. One example of the clock phase tuning information can be a delay version of clk1 and/or clk1.

Figure 9:
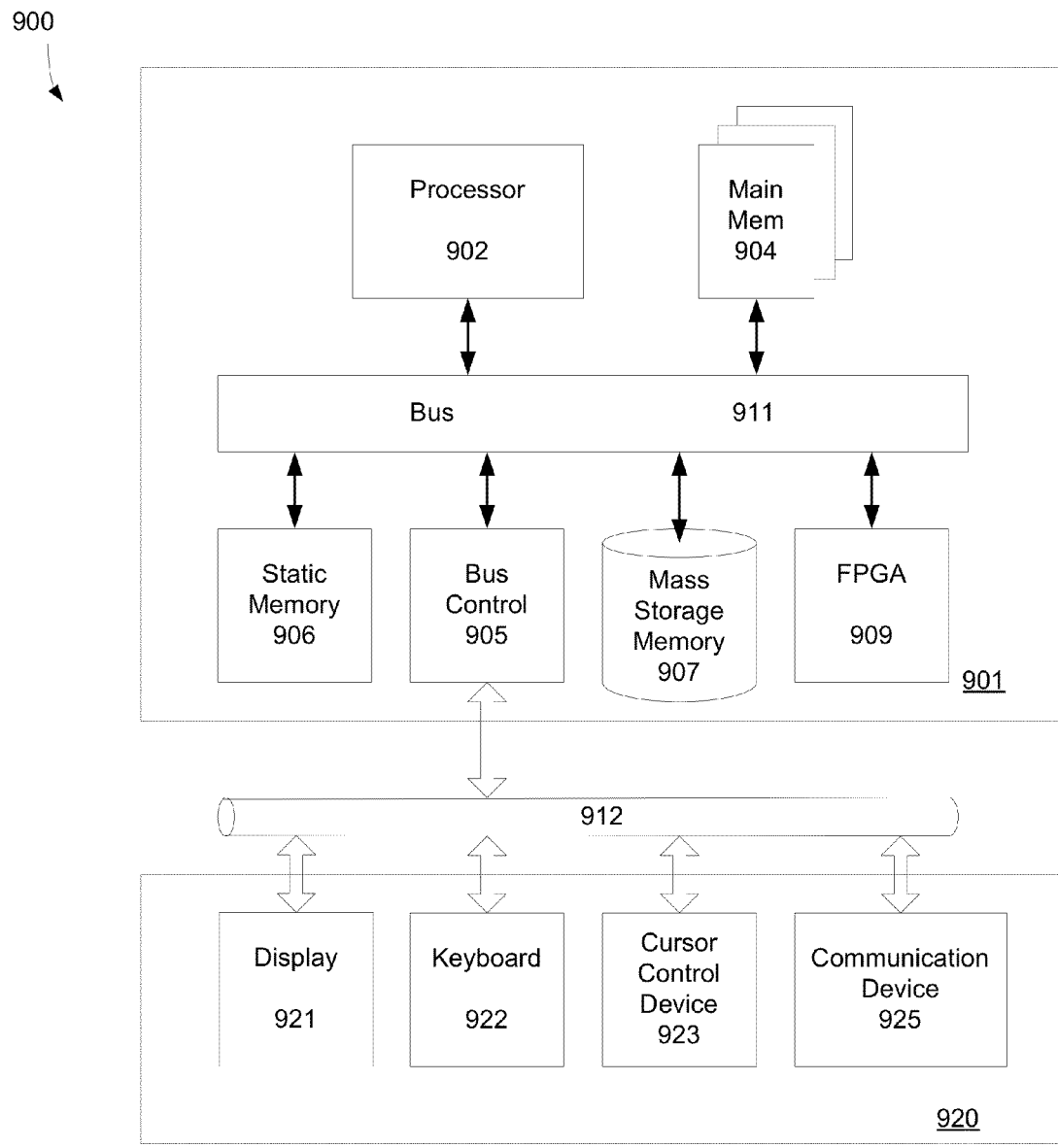
FIG. 9 is a diagram illustrating an example of digital processing system including FPGA using phase adjustment in accordance with one embodiment of the present invention.

Having briefly described one or more embodiments of automatic establishing a communications between ASIC and FGPA in which the present invention operates, FIG. 9 illustrates an example of a digital computing system 900, which may be used in a network system or personal computing, in which the features of the present invention may be implemented.

FIG. 9 is a diagram illustrating an example of digital processing system including FPGA using phase adjustment in accordance with one embodiment of the present invention. Computer system 900 includes a processing unit 901, an interface bus 911, and an input/output ("IO") unit 920. Processing unit 901 includes a processor 902, a main memory 904, a system bus 911, a static memory device 906, a bus control unit 905, a mass storage memory 907, and FPGA 909. FPGA 909 is able to provide a hybrid platform between FPGA and ASIC circuits. It should be noted that the underlying concept of the exemplary embodiment(s) of the present invention would not change if one or more blocks (circuit or elements) were added to or removed from diagram 900.

Bus 911 is used to transmit information between various components and processor 902 for data processing. Processor 902 may be any of a wide variety of general-purpose processors, embedded processors, or microprocessors such as ARM® embedded processors, Intel® Core™ 2 Duo, Core™ 2 Quad, Xeon®, Pentium™ microprocessor, Motorola™ 68040, AMD® family processors, or Power PC™ microprocessor.

Main memory 904, which may include multiple levels of cache memories, stores frequently used data and instructions. Main memory 904 may be RAM (random access memory), MRAM (magnetic RAM), or flash memory. Static memory 906 may be a ROM (read-only memory), which is coupled to bus 911, for storing static information and/or instructions. Bus control unit 905 is coupled to buses 911-912 and controls which component, such as main memory 904 or processor 902, can use the bus. Bus control unit 905 manages the communications between bus 911 and bus 912. Mass storage memory 907, which may be a magnetic disk, an optical disk, hard disk drive, floppy disk, CD-ROM, and/or flash memories are used for storing large amounts of data.

I/O unit 920, in one embodiment, includes a display 921, keyboard 922, cursor control device 923, and communication device 925. Display device 921 may be a liquid crystal device, cathode ray tube ("CRT"), touch-screen display, or other suitable display device. Display 921 projects or displays images of a graphical planning board. Keyboard 922 may be a conventional alphanumeric input device for communicating information between computer system 900 and computer operator(s). Another type of user input device is cursor control device 923, such as a conventional mouse, touch mouse, trackball, or other type of cursor for communicating information between system 900 and user(s).

Communication device 925 is coupled to bus 911 for accessing information from remote computers or servers, such as server or other computers, through wide-area network. Communication device 925 may include a modem or a network interface device, or other similar devices that facilitate communication between computer 900 and the network.

The exemplary aspect of the present invention includes various processing steps, which will be described below. The steps of the aspect may be embodied in machine or computer executable instructions. The instructions can be used to direct a general purpose or special purpose system, which is programmed with the instructions, to perform the steps of the exemplary aspect of the present invention. Alternatively, the steps of the exemplary aspect of the present invention may be performed by specific hardware components that contain hardwired logic for performing the steps, or by any combination of programmed computer components and custom hardware components.

Figure 10:
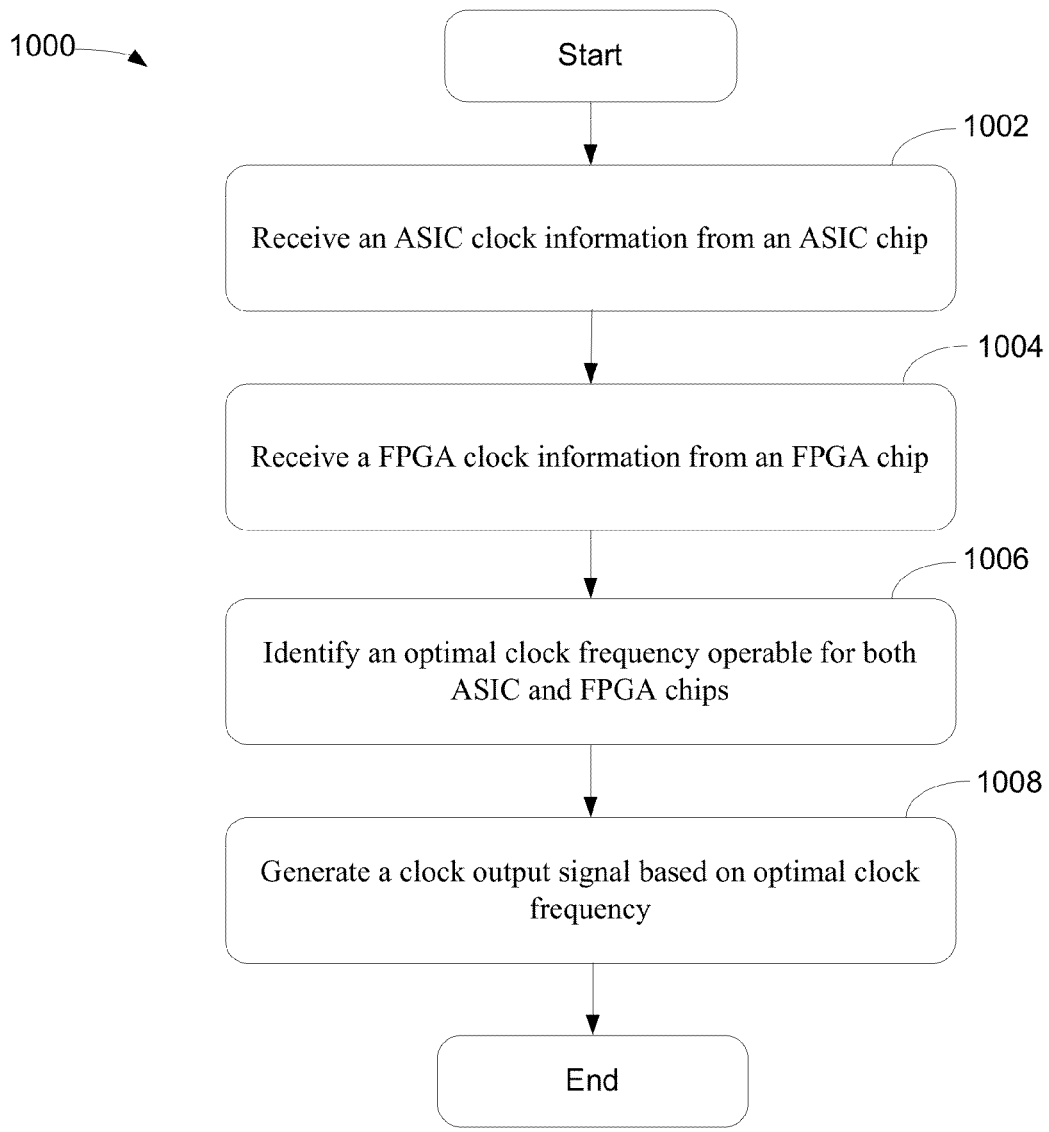
FIG. 10 is a flow chart illustrating a process of automatically establishing a communication between ASIC and FPGA using a scheme of clock skew control in accordance with one embodiment of the present invention.

FIG. 10 is a flow chart 1000 illustrating a process of automatically establishing a communication between ASIC and FPGA using a scheme of clock skew control in accordance with one embodiment of the present invention. At block 1002, a process of clock skew adjustment is able to receive ASIC clock information from an ASIC chip. The process is further capable of activating ASIC to perform a specific function in accordance with an ASIC clock domain. In one example, the ASIC clock information is captured using the ASIC clock frequency or signal.

At block 1004, upon receiving FPGA clock information, the FPGA chip is activated to perform a user selected function in accordance with a FPGA clock domain. It should be noted that FPGA clock usually has lower frequency rate than ASIC clock.

At clock 1006, an optimal clock frequency operable for both ASIC and FPGA chips is identified in accordance with the ASIC clock information and the FPGA clock information. In one embodiment, the optimal clock frequency is directed I/Os between FPGA and ASIC rather than for the entire FPGA and ASIC operations.

At block 1008, the process generates a clock output signal based on the optimal clock frequency and forwarding the clock output signal to the ASIC and the FPGA chips. In one aspect, ASIC clock domain may be modified in accordance with the clock output signal to reduce data loss during communication between the ASIC chip and the FPGA chip. Alternatively, FPGA clock domain may be modified in accordance with the clock output signal to reduce data loss during communication between the ASIC chip and the FPGA chip.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A data processing device, comprising:
an application specific integrated circuit ("ASIC") configured to perform a specific function in accordance with a first clock domain;
a configurable logic circuit ("CLC") coupled to the ASIC and configured to perform a programmable logic function in accordance with a second clock domain, wherein the CLC is a semiconductor based custom field programmable gate array ("cFPGA") having a plurality of lookup tables ("LUTs") and a plurality of nonvolatile programmable bits wherein the cFPGA is an integrated circuit able to be configured to one of user selected logic functions; and
a phase adjustment circuit coupled with the CLC, and able to facilitate communication between the ASIC and the CLC in accordance with the first clock domain and the second clock domain, wherein the phase adjustment circuit is configured to detect the first clock domain and the second clock domain and provides a calibration pattern to compensate phase difference to improve reliability of data capture travelling between the ASIC and the CLC in response to the first clock domain and the second clock domain.

2. The device of claim 1, wherein the ASIC is a semiconductor based integrated circuit that is customized for a particular functionality.

3. The device of claim 1, wherein the phase adjustment circuit is fabricated together with the cFPGA.

4. The device of claim 1, wherein the phase adjustment circuit includes a delay clock circuit configured to adjust a first clock in the first clock domain and adjust a second clock in the second clock domain so that data inputs between the ASIC and the CLC are captured reliably.

5. The device of claim 1, wherein the phase adjustment circuit includes a delay clock circuit configured to adjust a first clock in the first clock domain so that data inputs between the ASIC and the CLC are captured reliably.

6. The device of claim 1, wherein the phase adjustment circuit includes a delay clock circuit configured to adjust a second clock in the second clock domain so that data inputs between the ASIC and the CLC are captured reliably.

7. The device of claim 1, wherein the phase adjustment circuit is configured to detect the first clock domain and the second clock domain and provides a calibration pattern to compensate phase difference to improve reliability of data capture travelling between the ASIC and the CLC in response to the first clock domain and the second clock domain.

8. A system capable of processing digital information comprising the device of claim 1.

9. An integrated circuit ("IC") device, comprising:
an application specific integrated circuit ("ASIC") configured to perform a specific set of functions with a first data speed clocked by a first clock domain;
a configurable logic circuit ("CLC") coupled to the ASIC and configured to perform a programmable logic function with a second data speed clocked by a second clock domain; and
a phase adjustment circuit ("PAC") coupled with the CLC, and able to generate a calibration pattern based on the first clock domain and the second clock domain, wherein the ASIC is able to adjust clock cycle based on the calibration pattern to receive the second data from the CLC.

10. The device of claim 9, wherein the ASIC is able to adjust clock cycle based on the calibration pattern to transmit the first data to the CLC.

11. The device of claim 9, wherein the CLC is able to adjust clock cycle based on the calibration pattern to receive the first data from the ASIC.

12. The device of claim 9,
wherein the ASIC is a semiconductor based integrated circuit that is customized for a particular functionality; and
wherein the CLC is a semiconductor based field custom-programmable gate array ("cFPGA") having a plurality of lookup tables ("LUTs") and a plurality of nonvolatile programmable bits wherein the cFPGA is an integrated circuit able to be configured to one of user selected logic functions.

13. The device of claim 9, wherein the phase adjustment circuit includes a delay clock circuit configured to adjust a first clock in the first clock domain and adjust a second clock in the second clock domain so that data inputs between the ASIC and the CLC are captured reliably.

14. The device of claim 9, wherein the phase adjustment circuit includes a delay clock circuit configured to adjust a first clock in the first clock domain so that data inputs between the ASIC and the CLC are captured reliably.

15. The device of claim 9, wherein the phase adjustment circuit includes a delay clock circuit configured to adjust a second clock in the second clock domain so that data inputs between the ASIC and the CLC are captured reliably.

16. The device of claim 9, wherein the phase adjustment circuit is configured to detect the first clock domain and the second clock domain and provides the calibration pattern to compensate phase difference to improve reliability of data capture travelling between the ASIC and the CLC in response to the first clock domain and the second clock domain.

17. A digital processing system, comprising:
a central processing unit ("CPU") configured to execute instruction;
a memory coupled to the processor and able to store information; and
a data processing device coupled to the CPU and including,
an application specific integrated circuit ("ASIC") configured to perform a set of customized functions in accordance with an ASIC clock domain;
a custom field programmable gate array ("cFPGA") coupled to the ASIC and configured to perform a programmable logic function in accordance with a cFPGA clock domain; and
a phase adjustment circuit ("PAC") coupled with the cFPGA, and able to facilitate communication between the ASIC and the cFPGA in accordance with the ASIC clock domain and the cFPGA clock domain, wherein the phase adjustment circuit is configured to detect the first clock domain and the second clock domain and provides a calibration pattern to compensate phase difference to improve reliability of data capture travelling between the ASIC and the cFPGA in response to the first clock domain and the second clock domain.

18. The device of claim 17, wherein the phase adjustment circuit includes a delay clock circuit configured to adjust ASIC clock in the ASIC clock domain and adjust cFPGA clock in the cFPGA clock domain so that data inputs between the ASIC and the cFPGA are captured reliably.

* * * * *